US008059830B1

(12) United States Patent
Gleason et al.

(10) Patent No.: US 8,059,830 B1

(45) Date of Patent: Nov. 15, 2011

(54) AUDIO SYSTEM AND METHOD OF USE

(76) Inventors: Robert Connor Gleason, Foothill Ranch, CA (US); Thomas Louis Peterson, Huntington Beach, CA (US)

( * ) Notice: Subject to any disclaimer, the term of this patent is extended or adjusted under 35 U.S.C. 154(b) by 980 days.

(21) Appl. No.: 11/999,872

(22) Filed: Dec. 7, 2007

(51) Int. Cl.

| | |
|---|---|
| ***G01C 21/32*** | (2006.01) |
| ***H04R 5/00*** | (2006.01) |
| ***H03F 21/00*** | (2006.01) |
| ***H04B 1/00*** | (2006.01) |

(52) U.S. Cl. ........................................ 381/86; 281/86

(58) Field of Classification Search .................... 381/86, 381/161, 334, 230, 120, 88, 188, 332; 455/557; 701/213, 211, 208, 212

See application file for complete search history.

(56) References Cited

U.S. PATENT DOCUMENTS 3,471,706 A * 10/1969 Schneider .................... 307/10.1
5,146,618 A 9/1992 Wenner
5,546,468 A 8/1996 Beard
5,790,481 A 8/1998 Meitner
7,062,238 B2 6/2006 Glaza
2003/0120844 A1 6/2003 Hamel
2004/0185821 A1 9/2004 Yuasa
2004/0198305 A1 10/2004 Slutter et al.
2005/0049002 A1 3/2005 White et al.
2005/0089179 A1 * 4/2005 Laraia .......................... 381/120
2005/0261789 A1 11/2005 Chen
2006/0046778 A1 3/2006 Hembree
2006/0172780 A1 8/2006 Krippgans
2007/0077965 A1 * 4/2007 Fox ............................... 455/557
2007/0139878 A1 6/2007 Giffin et al.
2007/0203646 A1 * 8/2007 Diaz et al. ..................... 701/213
2008/0226101 A1 * 9/2008 Silber et al. ................... 381/123
2009/0060208 A1 * 3/2009 Pan et al. ........................ 381/17

* cited by examiner

*Primary Examiner* — Dao H Nguyen

*Assistant Examiner* — Tram H Nguyen

(74) *Attorney, Agent, or Firm* — Mind Law Firm; Jeromye V. Sartain; Justin G. Sanders

(57) ABSTRACT

A secondary audio system for use in a vehicle equipped with a primary audio system connected to a power source of the vehicle and including at least an in-dash head unit. The secondary audio system includes an amplifier installed in the vehicle and directly connected to the power source and to at least one speaker installed in the vehicle, the amplifier comprising at least one means for receiving audio content. A portable media player having audio content stored therein is operably connected to the amplifier through the at least one receiving means, whereby the amplifier is powered by the power source for playing the audio content stored in the portable media player through the at least one speaker, such that the secondary audio system is operably installed within the vehicle without affecting the primary audio system and specifically without utilizing, removing or rendering inoperable the head unit.

22 Claims, 6 Drawing Sheets

AUDIO SYSTEM AND METHOD OF USE

INCORPORATION BY REFERENCE

Applicant(s) hereby incorporate herein by reference any and all U.S. patents and U.S. patent applications cited or referred to in this application.

BACKGROUND OF THE INVENTION

1. Field of the Invention

Aspects of this invention relate generally to audio systems, and more particularly to vehicle audio systems.

2. Description of Related Art

By way of general background, in the classic car market there is the need or desire to be able to install a new, high-fidelity car audio system without affecting the car's original equipment or vintage look. To date, classic car enthusiasts have been forced to either replace the car's original AM unit ("header") with a new in-dash CD-AM/FM tuner or the like or mount such a new header unit somewhere else in or under the dashboard or perhaps in the glove box, in any case adversely affecting the vehicle's original look and/or equipment. Other known prior art attempts involve new stereo headers designed to look like a particular vehicle's original AM header unit, which is impractical considering the number and variety of such original radios across the spectrum of classic cars and other vehicles. This approach is also undesirable because it again involves removal of the original, vintage AM tuner.

The following art further defines the present state of this field:

U.S. Pat. No. 5,146,618 to Wenner discloses an apparatus including a main housing, with a first and second detachable speaker mounted thereto, each speaker includes a positive and common connection for selective association with an automotive speaker wiring harness. The apparatus includes a cavity for reception of a vehicular radio therewithin and selectively removable forward panels to receive an additional booster amplifier in an upper section and storage, wherein the storage includes an aligned series of "T" shaped recesses to selectively receive audio cassette members or compact disk plates selectively within each "T" shaped slot.

U.S. Pat. No. 5,546,468 to Beard discloses a combination speaker and amplifier unit having a speaker located on the front of a cabinet and speaker wire receptacles located in the back of the cabinet for providing speaker wire connections to a stereo unit. Also in the back of the cabinet is a power booster amplifier mounted thereon for amplifying the left and right stereo signals provided by the stereo unit. A power cable extends out the base of the power booster amplifier which is mounted to a cut-out section of the back of the cabinet so as to place the power booster amplifier within the cabinet. The power cable has a cigarette lighter adapter plug allowing the power booster amplifier to by powered by the power supplied to the cigarette lighter socket of an automobile.

U.S. Pat. No. 5,790,481 to Meitner discloses that installing a high quality audio source, such as a CD player, in an automobile often requires installation of a radio/tuner of sufficient quality to provide an audio signal corresponding to the quality of the audio source. In leased automobiles this presents a problem because of warranty and return conditions. The problem is solved by using a separate amplifier connected into the wiring between the factory installed radio/tuner and loudspeakers and sensing the setting of the radio/tuner control knobs by placing a defined modulated carrier on the antenna input of the radio/tuner. The output of the radio/tuner then provides a signal reflecting the setting of the control knobs. This signal is used to control the amplifier.

U.S. Patent Application Publication No. 2003/0120844 to Hamel discloses an audio storage and reproducing apparatus. The apparatus selectively operates in at least three different modes: as an addressable member of a computer network, as a portable audio player, and as an in-vehicle audio player. While in a computer network, the apparatus can function as a server for audio data files. While in the other modes of operation, the apparatus can serve as a personal audio player.

U.S. Patent Application Publication No. 2004/0185821 to Yuasa discloses when an automatic battery detector detects that the remaining capacity of a battery has become lower than a predetermined value, a central processing controller lengthens the continuous operation time by reducing power consumption. The central processing controller controls a radio communication device to switch the operation mode from class 2 to class 3. Class 2 provides a high output level, and class 3 provides a low output level. Alternatively or additionally, the central processing controller controls a D/A conversion amplifier circuit to turn off a Dolby system.

U.S. Patent Application Publication No. 2004/0198305 to Slutter et al. discloses a mobile radio receiver system for a vehicle providing recent segment replay function. The wireless receiver is adapted to be contained within the vehicle. A digital delay line is coupled to receive the output of the wireless receiver. A delay selection switch is coupled to the digital delay line to route the output of the wireless receiver with a selected temporal delay in response to actuation by a person riding in the vehicle. In accordance with the preferred embodiment, the recent transmitted segment ends at the time that the delay selection switch is actuated. A control device is associated with the wireless receiver for receiving control selections from the person riding in the vehicle. An amplifier is coupled to receive the routed output of the wireless receiver. An audio transducer thus is adapted to receive the output of the amplifier and provide an audible signal to the person riding in the vehicle.

U.S. Patent Application Publication No. 2005/0049002 to White et al. discloses an audio system and method. A system incorporating teachings of the White disclosure may include, for example, an electronic device having a display, a memory, an audio file player, and a housing component at least partially defining a cavity in which the memory and the audio file player are secured. In one embodiment, the electronic device may be a portable MP3 player. The system may also include a processor or playlist engine that can maintain a first playlist and a second playlist. In practice, the first playlist may include a selection of audio content having a corresponding audio file saved in the memory of the electronic device. In one embodiment, the system may also include an automobile having an automobile sound system that has a speaker and an in dash sound system component, which may be removably coupled to the electronic device via a cable. The in dash sound system component may have a selector, which may be, for example, a button, that allows a user to select the first playlist for outputting via the speaker. The cable interconnecting the electronic device and the in dash sound system component may be capable of providing power to the electronic device in addition to communicatively coupling the electronic device to the automobile sound system.

U.S. Patent Application Publication No. 2005/0261789 to Chen discloses an audio wireless transmission and receiving and amplifying system which includes an audio wireless transmission device and an audio receiving and amplifying device. The audio wireless transmission device aims to encode an analog audio signal to conform to Bluetooth wireless transmission standard for transmission. The audio receiving and amplifying device receives the audio signal conformed to the Bluetooth wireless transmission standard; the audio signal passes through an analog/digital power amplifier and is output. The provided system may be equipped with many different types of multimedia players to receive, record and broadcast multimedia audio signals in a wireless fashion.

U.S. Patent Application Publication No. 2006/0046778 to Hembree discloses a system for removably connecting and interfacing an electronic portable audio device with an otherwise substantially conventional vehicle audio system to facilitate listening to playback of electronic music files stored on the portable audio device. A docking connector for receiving the portable audio device is physically and operatively integrated into a shared housing with the vehicle audio system, and a single set of controls is provided for controlling operation of both the portable audio device and all conventional components of the vehicle audio system. A removable interface module allows for adapting the system for use with differently designed portable audio devices.

U.S. Pat. No. 7,062,238 to Glaza discloses a method and system for connecting an in-vehicle radio to a wireless device. A user selection input is provided to the in-vehicle radio. A local broadcast frequency is determined based on the user selection input. A broadcast request message including the local broadcast frequency is sent to the wireless device, and the radio is tuned to the local broadcast frequency.

U.S. Patent Application Publication No. 2006/0172780 to Krippgans discloses an audio system for use in a vehicle. The audio system comprises one or more loudspeakers of the vehicle and a receiver operating to receive digital data in first and second digital audio data formats. The first digital audio data format corresponds to a format used by a mobile audio device to wirelessly transmit digital audio stored on the mobile audio device. The second digital audio data format corresponds to a wireless audio data transmission format that differs from the first digital audio data format. The receiver may operate in multiple routing modes. In a first routing mode, the receiver responds to the receipt of digital data in the first digital audio data format by routing the digital data through the audio system for ultimate output as analog audio at the loudspeakers. The receiver operates in a second routing mode in response to receiving digital data in the second digital audio data format to route digital data in the second digital audio data format through the system for ultimate output as analog audio at the loudspeakers. The receiver may automatically switch between the first routing mode and the second routing mode based on whether digital data received by the receiver is in the first or second digital audio data format. Further, the audio system may be configured so that the second routing mode has priority over the first routing mode with respect to ultimate output at the loudspeakers. In one example, the first digital audio format is a Bluetooth audio format while the second digital audio format comprises a Bluetooth hands-free communications format.

U.S. Patent Application Publication No. 2007/0139878 to Giffin et al. discloses a vehicle media system for use in conjunction with a portable media device. The vehicle media system includes an input module that is mountable, for example, at a console between the driver's seat and front passenger seat of the vehicle cabin, so that it may be manipulated by a user pursuant to input of system commands. A display module is mountable at a different location within the vehicle cabin, such as on the dashboard. A main module is connected to cooperate with the display module and the input module to facilitate user interaction with the portable media device.

The prior art described above teaches an automotive radio support and conversion apparatus, a portable speaker and amplifier unit, a retrofitable CD player system, a digital music server and portable player, an electronic apparatus and system control method for the electronic apparatus, an onboard electronic system with user controlled temporal characteristics, an audio system and method, an audio wireless transmission and receiving and amplifying system, a system for listening to playback of music files by a portable audio device while in a vehicle, a radio frequency selection method and system for audio channel output, a vehicle audio system capable of playing wireless audio data received from a mobile audio player, and a vehicle media system, but does not teach a stand-alone audio system that can be installed in a vehicle without in any way affecting or utilizing the original or in-dash audio system head unit. Aspects of the present invention fulfill these needs and provide further related advantages as described in the following summary.

SUMMARY OF THE INVENTION

Aspects of the present invention teach certain benefits in construction and use which give rise to the exemplary advantages described below.

In a first aspect of the audio system and method of the present invention, a secondary audio system including an amplifier is installed in a vehicle and connected to a power source of the vehicle, the amplifier comprising at least one means for connecting to a portable media player having audio content stored therein and specifically not being connected to a primary audio system of the vehicle including at least an in-dash head unit, such that the secondary audio system is operably installed within the vehicle without affecting the primary audio system and specifically without utilizing, removing or rendering inoperable the head unit.

In a further aspect of the audio system and method of the present invention, at least one secondary speaker is installed in the vehicle separate from at least one primary speaker of the primary audio system and connected to the amplifier, whereby the amplifier is powered by the power source and is connected to by the portable media player for playing the audio content stored in the portable media player through the at least one secondary speaker.

In a still further aspect of the audio system and method of the present invention, at least one audio input is mounted in the amplifier and electrically connected to a detection circuit input of the amplifier for selecting the portable media player connected through a wired connection via the at least one audio input.

In a yet further aspect of the audio system and method of the present invention, a wireless antenna is electrically connected to a receiver mounted in the amplifier, the receiver being further electrically connected to a detection circuit input of the amplifier for selecting the portable media player connected through a wireless connection via the antenna and receiver.

In a still further aspect of the audio system and method of the present invention, the portable media player is non-wireless and so is connected to an intermediate transmitter for wirelessly connecting to the amplifier.

In a yet further aspect of the audio system and method of the present invention, the transmitter and receiver together operate on the A2DP protocol.

Other features and advantages of aspects of the present invention will become apparent from the following more detailed description, taken in conjunction with the accompanying drawings, which illustrate, by way of example, the principles of aspects of the invention.

BRIEF DESCRIPTION OF THE DRAWINGS

The accompanying drawings illustrate aspects of the present invention. In such drawings.

DETAILED DESCRIPTION OF THE INVENTION

Figure 1:
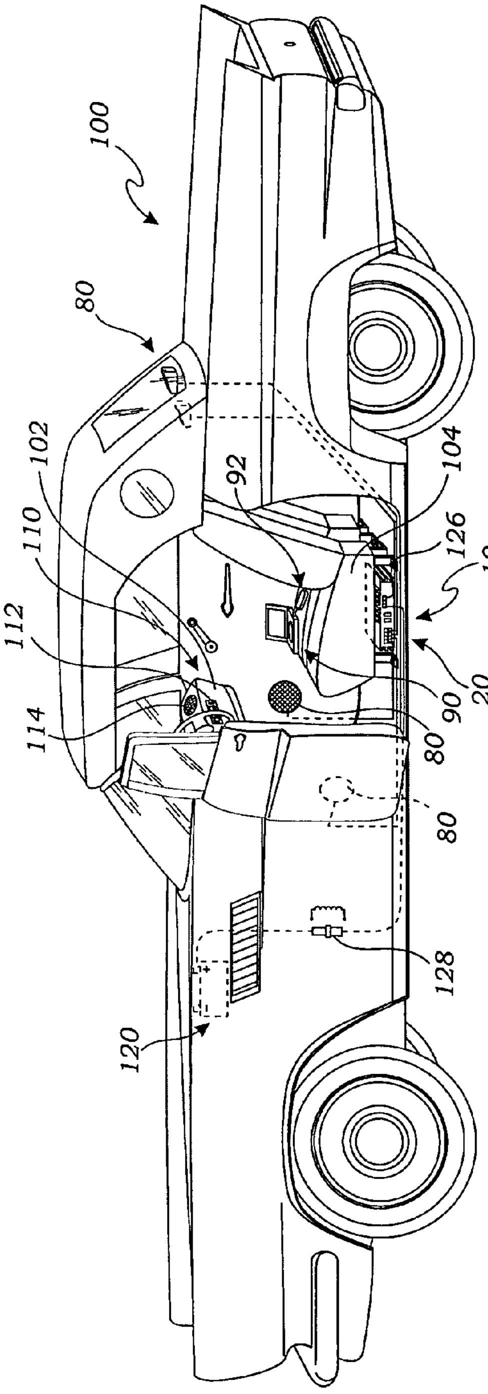
FIG. 1 is a perspective view of an exemplary embodiment of the audio system of the present invention as installed in a vehicle.

The above described drawing figures illustrate aspects of the invention in at least one of its exemplary embodiments, which are further defined in detail in the following description.

By way of overview, in one aspect of the invention, a classic car's AM tuner, or head unit, and entire original audio system is left completely intact, whether operational or not, and a second, parallel audio system is then installed substantially separately from the original audio system. This second audio system essentially entails a high-power amplifier that would be placed under a seat or at some other location in the vehicle and be hard-wired only to the vehicle's power system (positive, ACC, and common ground). The amplifier would also be connected to the one or more original speakers of the vehicle, if sufficient, and/or to one or more new speakers that could also be placed under the seat(s), in the rear or front window areas, or in replaceable door panels (the original door panels could be reinstalled if the new audio system were to later be removed). Such a stand-alone audio system would then further include or operate in conjunction with basically any audio or media player now known or later developed that can be connected (wired or wirelessly) to such an amplifier. As such, the portable media player serves as both the intelligence and the control for the music or other audio content played through the amp, completely eliminating the need for a "header" unit, whether in the dash or otherwise. It will be appreciated by those skilled in the art that in this manner a stand-alone audio system according to the present invention can be installed in a vehicle without in any way affecting the original audio system, specifically without utilizing, removing or rendering inoperable the head unit, whether original or after-market, and without permanently affecting any other aspect of the vehicle's original equipment. In the classic car market it will be appreciated that such an ability to install a new high-fidelity audio system while leaving the original, vintage audio system in place has tremendous value and appeal. Moreover, it will be appreciated that the same benefits can be derived in other contexts, such as when it is desirable to upgrade a car audio system "secretly," whereby the factory or replacement head unit is left in the dash unaffected and the new audio system components are installed in other locations within the vehicle substantially out of sight to normal visual inspection from outside the vehicle. Therefore, a stand-alone audio system according to the present invention is conveniently installed and operated in any vehicle, including cars, trucks, RVs, big rigs, boats, aircraft, or any other such vehicles, without the downside of having to replace any or all of the original audio system's components, including whatever head unit or tuner already exists. Again, then, according to aspects of the present invention, the portable media player effectively serves as the head unit, rendering a new or replacement head unit or retrofitting the existing head unit in some way completely unnecessary. Those skilled in the art will thus appreciate that while at least one particular embodiment of an amplifier according to aspects of the present invention and its installation within an exemplary vehicle are shown and described, the invention is not so limited. Rather, aspects of the audio system of the present invention essentially entail any amplifier now known or later developed as being capable of interfacing with a portable media player through a wired or wireless connection and being connected to a power source of a vehicle and speakers installed in the vehicle so as to selectively play content from the media player without any involvement of the vehicle's head unit or tuner.

In more detail, referring first to FIG. 1, there is shown a perspective view of a secondary audio system 10 according to aspects of the present invention installed within a vehicle 100. The vehicle 100 is shown as already being equipped with an in-dash original or primary audio system 110 connected to a power source 120 of the vehicle, such as a conventional 12-volt battery, the system 110 including at least a head unit 112 and a primary speaker 114 installed in the dash 102. While a 12-volt battery as the power source 120 and corresponding 12-volt terminals on the amplifier 20 (FIG. 2) have been shown and described throughout, it will be appreciated by those skilled in the art that virtually any power source now known or later developed, and at whatever rating, can be employed in connection with the secondary audio system 10 of the present invention, with the amplifier 20 and other components being electrically configured as appropriate. Specifically, it is known in the art that some older vehicles utilize 6-volt rather than 12-volt systems, in which case the amplifier 20 could be configured accordingly with 6-volt power terminals and other necessary electronics. Whether or not the primary audio system 110 is operational, the secondary audio system 10 is installed in the vehicle 100 for improved sound quality and performance according to the needs and desires of the vehicle's owner or operator. Specifically, an amplifier 20 is installed in the exemplary embodiment under the driver-side front seat 104 and is also wired to the vehicle's power source 120. At least one secondary speaker 80 separate from the at least one primary speaker 114 and connected to the amplifier 20 is installed in the door panel 106, for example. A portable media player 90 is then selectively connected to the amplifier 20, shown in the exemplary embodiment of FIG. 1 as a wireless connection, more about which is said below generally in connection with FIGS. 6-8 and the audio system of the present invention in use, whereby the amplifier 20 is powered by the vehicle power source 120 and is connected to by the portable media player 90 for playing audio content stored in the portable media player 90 through the at least one secondary speaker 80, such that the secondary audio system 20 is operably installed within the vehicle 100 without affecting the primary audio system 110 and specifically without necessarily utilizing, removing or rendering inoperable the head unit 112 and the primary speaker 114. Again, it will be appreciated by those skilled in the art that while a particular type of vehicle and installation of the secondary audio system 10, and the amp 20 particularly, has been shown and described, the invention is not so limited, such that the installation of FIG. 1 is to be understood as merely exemplary. By way of further example, it will be appreciated that the amplifier 20 could have been wired to the primary speaker 114 alone or to both the primary speaker 114 and the secondary speaker 80, depending on the condition and performance qualities of the respective speakers 80, 114 and other considerations of the vehicle's owner or operator. Specifically, in any case where at least one of the original speakers 114 is to be utilized by the secondary audio system 10 of the present invention, it will be appreciated that a simple splitter (not shown) as is known and used in the art can be provided with the speaker hook-ups so that the at least one original speaker is effectively shared by both the original head unit 112 and the amplifier 20. Further, the amplifier 20, while shown under the driver-side front seat 104, may also be under the passenger-side front seat, behind the front seat, in the trunk, or in any other suitable location within the vehicle 100.

Figure 2:
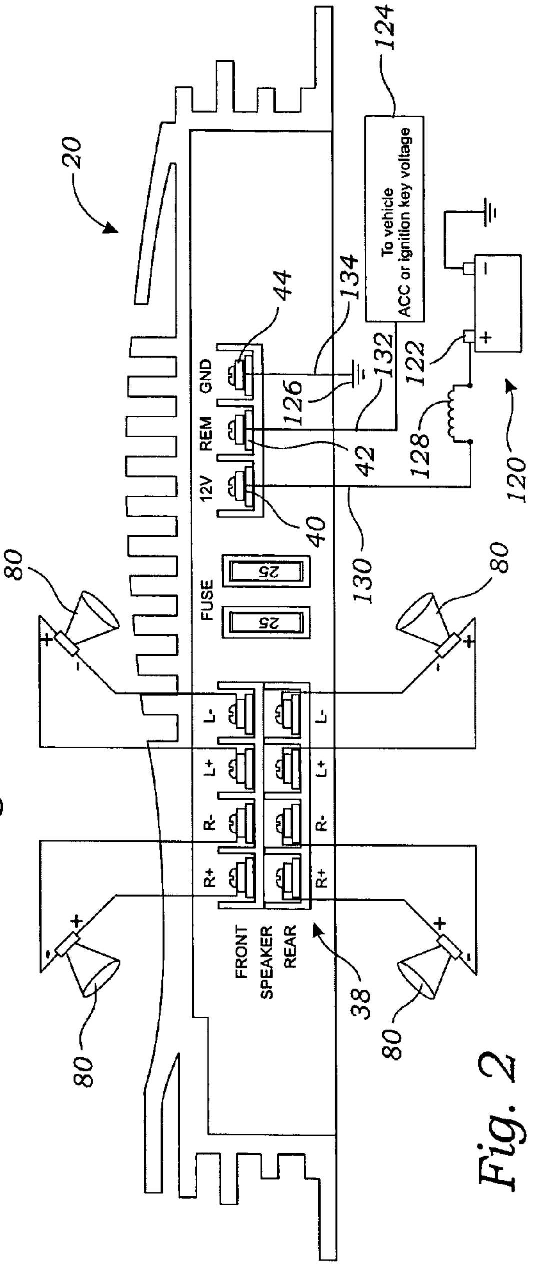
FIG. 2 is a wiring schematic thereof.

Turning now to FIG. 2, there is shown a wiring schematic further representing the exemplary installation of the amplifier 20 within the vehicle 100. Here, with the amp 20 as viewed from its left side, there is shown a primary power line 130 connecting the permanent 12-volt terminal 40 of the amp 20 with the positive terminal 122 of the battery 120. In the exemplary embodiment, the power cable 130 is 8-10 AWG rated and a fuse 128 is installed in the power line 130 preferably within one foot of the positive terminal 122 so as to prevent or deter a cable fire in case of a short circuit. An auxiliary power cable 132 connects the auxiliary or remote 12-volt terminal 42 on the amp 20 to the vehicle's ACC (accessory) or ignition voltage 124. In the exemplary embodiment, the auxiliary power cable 132 is preferably rated at 20 AWG. And finally, a ground cable 134 preferably of no longer than four feet is connected from the ground terminal 44 of the amplifier 20 to the vehicle's chassis or common ground, such as a large chassis bolt 126 near the amplifier 20 as shown in FIG. 1. With continued reference to FIG. 2, the positive and negative wires from the one or more primary or secondary speakers 114, 80 are connected to the speaker output terminals 38 of the amp 20. In the exemplary embodiment, left and right front and rear speakers, or eight wires total, are connected to the amp 20 in a conventional four-channel mode arrangement, though it will again be appreciated by those skilled in the art that a number of other speaker arrangements now known or later developed may be incorporated in the present invention without departing from its spirit or scope, including but not limited to a bridged mode or a three-channel mode. Moreover, were it desirable in any such arrangement to utilize more than four speakers, it will be appreciated that additional speaker terminals may easily be incorporated into the amplifier 20 as required.

Figure 3:
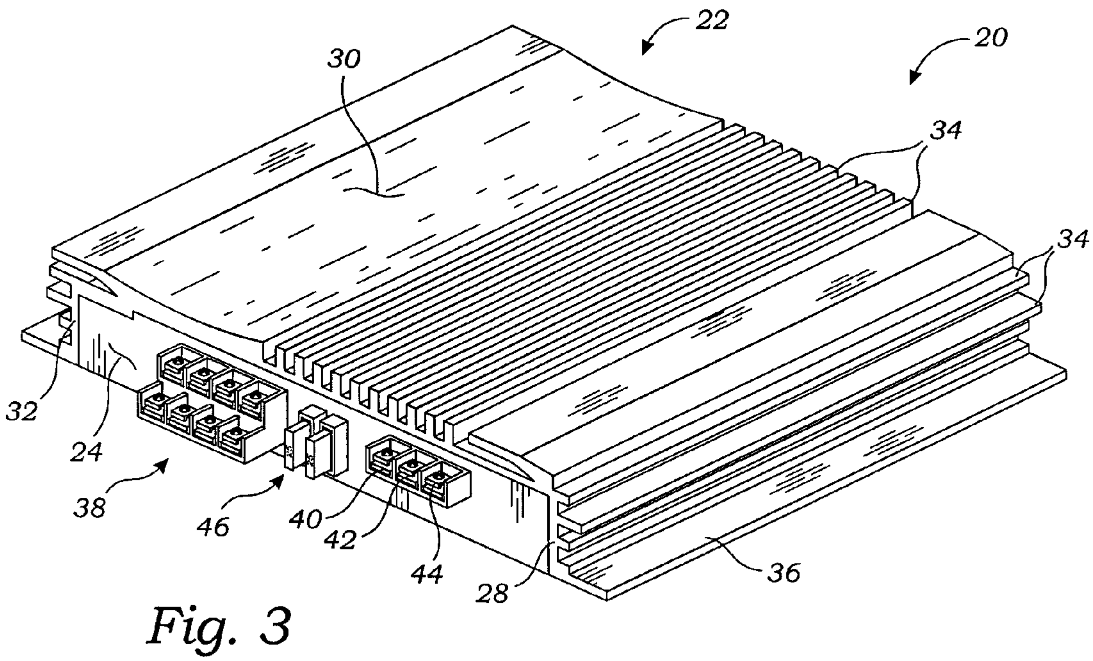
FIG. 3 is an enlarged left perspective view of the amplifier thereof.
Figure 4:
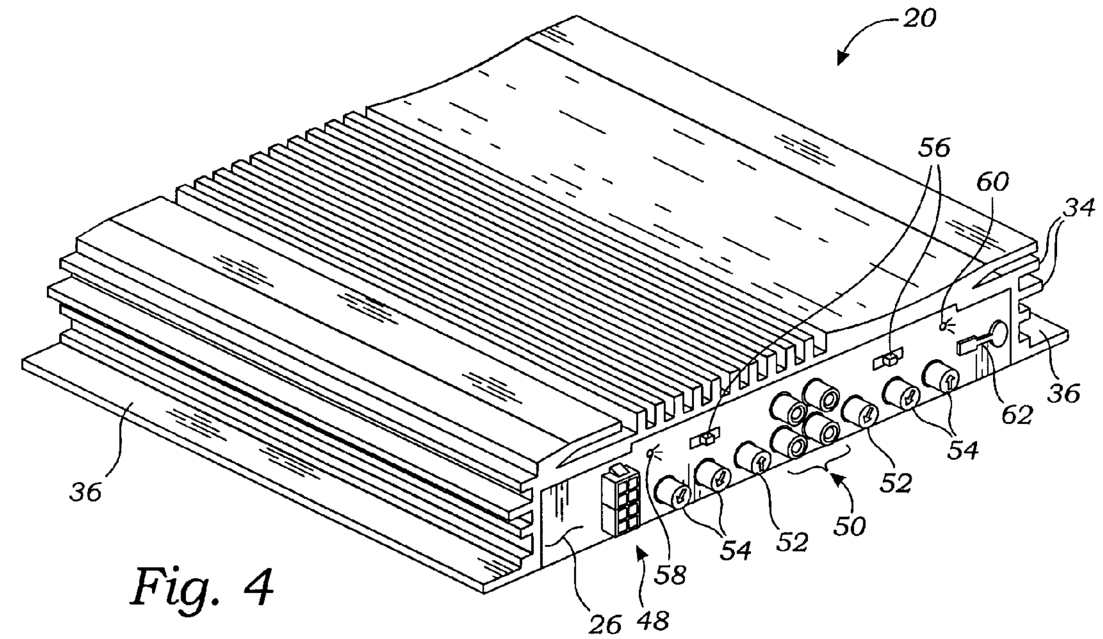
FIG. 4 is an enlarged right perspective view of the amplifier thereof.
Figure 5:
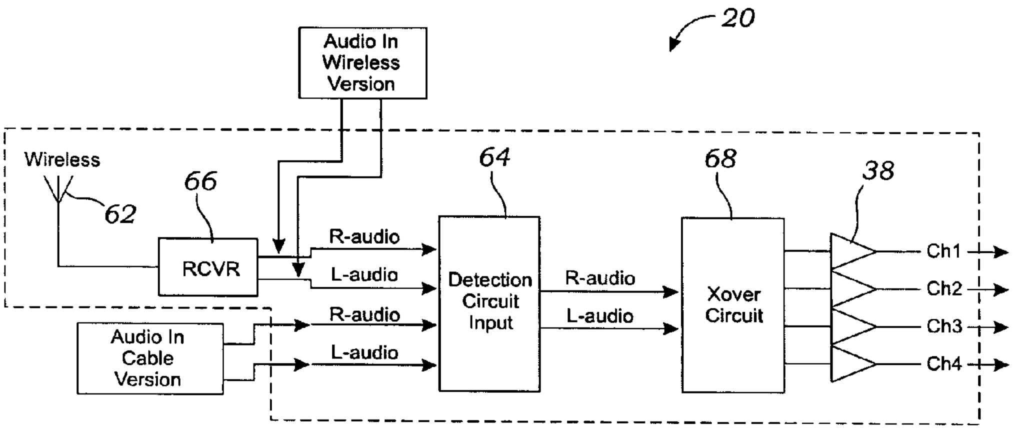
FIG. 5 is a block diagram of the amplifier thereof.

Referring to FIGS. 3 and 4, there are shown enlarged left and right perspective views, respectively, of an exemplary amplifier 20 according to aspects of the present invention. The amp 20 generally includes a housing 22 and internal circuitry as best shown in FIG. 5. In the left and right side walls 24, 26 of the housing 22 there are installed a number of terminals, connectors, controls and the like as are generally known and used in the art and wired to the circuit board for electrical operability of the amplifier 20, more about which is said below. The front, top and/or back walls 28, 30, 32 of the amplifier housing 22 may be formed with one or more cooling fins 34 for heat dissipation from the amp 20 during operation. The front and back walls 28, 32 may also include laterally-projecting mounting tabs 36 for installation of the amplifier 20 on a surface in any suitable manner now known or later developed in the art. With reference to FIG. 3, specifically, in the exemplary embodiment, within the left side wall 24 there are mounted the speaker output terminals 38, the permanent 12-volt terminal 40, the remote 12-volt terminal 42, and the ground terminal 44. There may also be mounted in the housing 22 one or more amp fuses 46 for easy inspection and replacement as needed. Turning to FIG. 4 and a right perspective view of the exemplary amplifier 20, there are shown mounted in the right side wall 26 various other components, including high-level audio inputs 48 and low-level audio inputs 50, front and rear input level adjustments 52, filter adjustments 54, and high/low pass switches 56, a power indicator 58, a protection indicator 60, and a wireless antenna 62. Those skilled in the art will appreciate that while a particular configuration of the amp housing and selection and arrangement of terminals, inputs, adjustments, switches, and indicators mounted thereon is shown and described, the invention is not so limited, but instead a variety of configurations and electrical devices now known or later developed may be employed in the amplifier without departing from the spirit and scope of the present invention. It is particularly noted that while a non-descript wireless antenna 62 of a certain configuration is shown, the invention may entail any such antenna now known or later developed for wireless transmission of data to or from the amplifier 20, including but not limited to a Bluetooth® A2DP antenna.

Turning then to FIG. 5, there is shown a block diagram of some of the significant components of the internal circuitry of an amplifier 20 according to aspects of the present invention. A detection circuit input 64 is configured within the amp 20 so as to receive the left and right audio inputs from the portable media player 90 (FIGS. 1 and 6-8), either wired or wirelessly. If "wired," the media player 90 would be connected to the amp 20 as explained more fully below in connection with the exemplary embodiment of the system 10 in use as shown FIG. 6, which connection would be detected by the detection circuit input 64, either manually or automatically. Similarly, if a wireless connection is made to the amp 20, the wireless signal originating directly from the media player 90 (FIG. 8) or from an intermediate transmitter 92 (FIG. 7) is received by the wireless antenna 62 and passed through a receiver 66 ("RCVR") to the detection circuit input 64. In either case, again, the detection circuit input 64 is capable of selecting the proper audio source, or "choosing" between the "wired" or "wireless" input, whether manually as through a switch (not shown) installed in the housing 22 of the amp 20 or automatically as by measuring the impedance of the input lines, for example. From the detection circuit input 64, the left and right channels of the selected audio signal are then sent to the "XOVER" or crossover circuit 68. The crossover circuit 68 accepts both the left and right channels of the audio signal and performs the necessary filtering, such as setting crossover frequencies, adjusting gain levels, and the like, as dictated at least in part by the adjustments and selections made by the operator via the input level adjustments 52, filter adjustments 54, and high/low pass switches 56 operably mounted in the housing 22 of the amplifier 20. The output of the crossover circuit 68 goes to the speakers through the speaker output terminals 38 also installed in the housing 22, as previously described in connection with FIG. 2, particularly. While four channels are shown in FIG. 5, once more, it will be appreciated that multiple channels, and hence multiple speakers, beyond the typical four-channel arrangement are possible without departing from the spirit and scope of the invention. It will also be appreciated that a number of other electrical components now known or later developed in the art for powering and controlling such an amplifier may be employed in and are beyond the scope of the present invention, and so for simplicity are not shown in FIG. 5.

Figure 6:
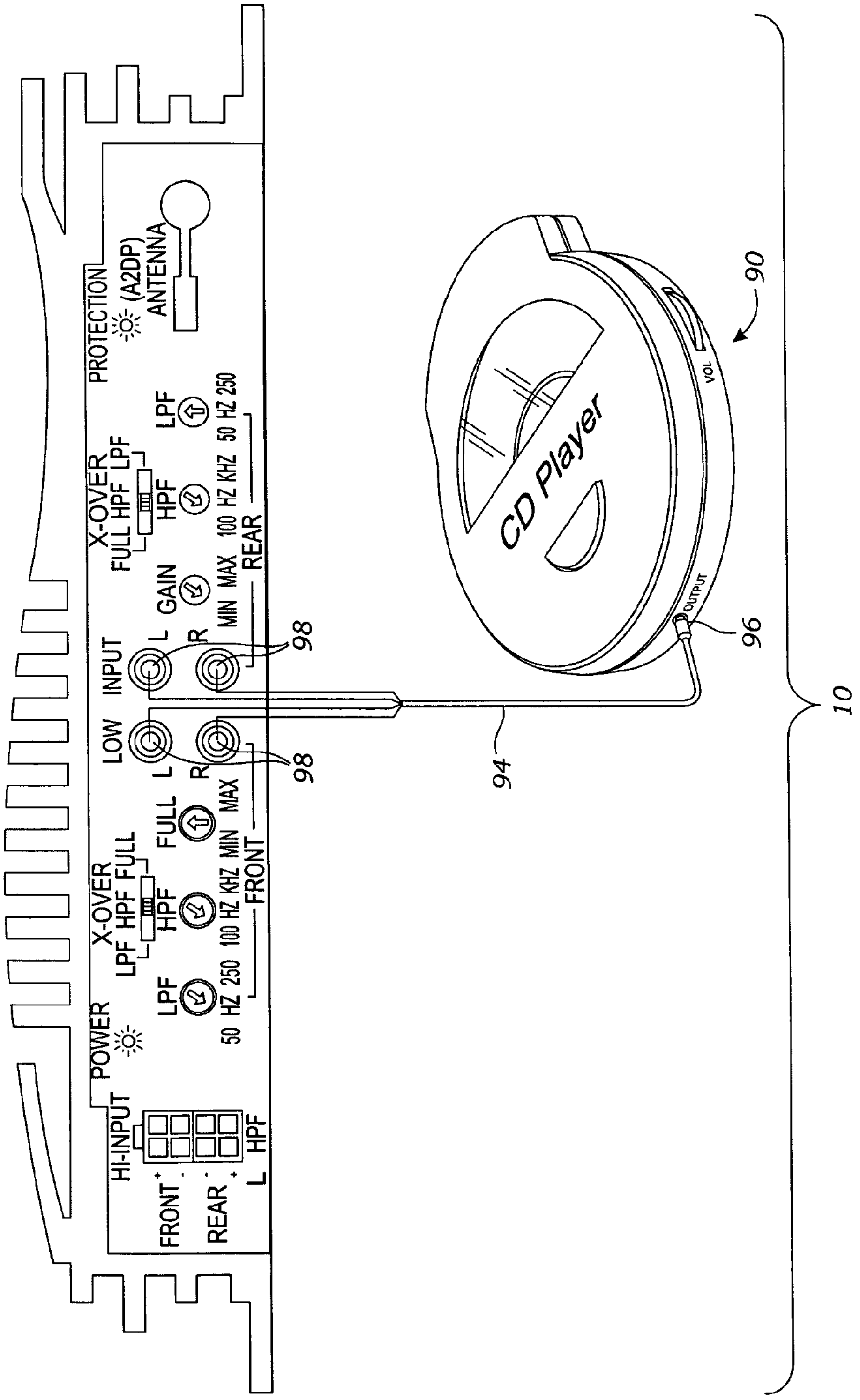
FIG. 6 is a schematic illustrating use thereof in a first exemplary configuration.

Referring now to FIG. 6, there is shown a schematic of the secondary audio system 10 of the present invention in a first exemplary configuration during use wherein the amplifier 20 is interfacing through a wired connection with a media player 90 taking the form of a portable CD player. As a threshold matter, it is noted that while the portable media player 90 is shown in the exemplary embodiments of FIGS. 6-8 as being a part of the secondary audio system 10 and the secondary speakers 80 are not shown, it will be appreciated that the "system" as sold may include the amp alone, the amp in combination with either a media player or speakers, or all three. Specifically, then, it is to be expressly understood that system may be any such combination of devices and so is not limited to any one such combination, again, employing wired or wireless connections of any such devices now known or later developed. In the configuration of FIG. 6, then, showing a "wired" connection of an exemplary portable CD player 90, an audio cable 94 is simply connected between the player 90 and the amplifier 20. Specifically, at one end of the audio cable 94 a standard 3.5 mm headphone plug 96 is plugged into the headphone jack (not shown) of the CD player 90 and four RCA plugs 98 at the other end of the audio cable 94 are plugged into corresponding ones of the left and right front and rear low-level RCA audio inputs 50 mounted in the left side wall 26 of the amp's housing 22. As explained above in connection with FIG. 5, it may be that the detection circuit input 64 of the amplifier 20 will automatically detect the wired connection of the player 90 to the amp 20 and select and transfer the left and right audio signals to the crossover circuit 68 accordingly, or the "wired" operation of the amp 20 may simply be manually selected by the operator through a switch (not shown) at the same time the audio cable 94 is plugged into the amp 20. Either way, once the player 90 is so connected, it may be operated in a conventional fashion so as to play selected music through the one or more primary and/or secondary speakers 114, 80 of the vehicle 100 as powered by the amp 20, again all without affecting or in any way operating the vehicle's existing in-dash head unit 112 (FIG. 1). Once more, those skilled in the art will appreciate that while a particular configuration of the media player and its wired connection to the amp are shown and described, numerous other players now known or later developed and corresponding connections may be employed in conjunction with the present invention without departing from its spirit and scope. By way of further example, though a portable CD player is shown as the media player 90 in the wired configuration, it will be appreciated that virtually any player having an audio output, even if not a standard 3.5 mm headphone jack, with the appropriate audio cable 94, may be plugged into the amp 20 for selectively playing therethrough, such media players 90 including but not limited to cassette players, CD players, MP3/MP4 players, cell phones, XM radios, and even laptop computers and other such PDA devices capable of storing audio files and equipped with the necessary connection jacks and/or wireless transmitters, as in the alternative embodiments of FIGS. 7 and 8 discussed in turn below.

Figure 7:
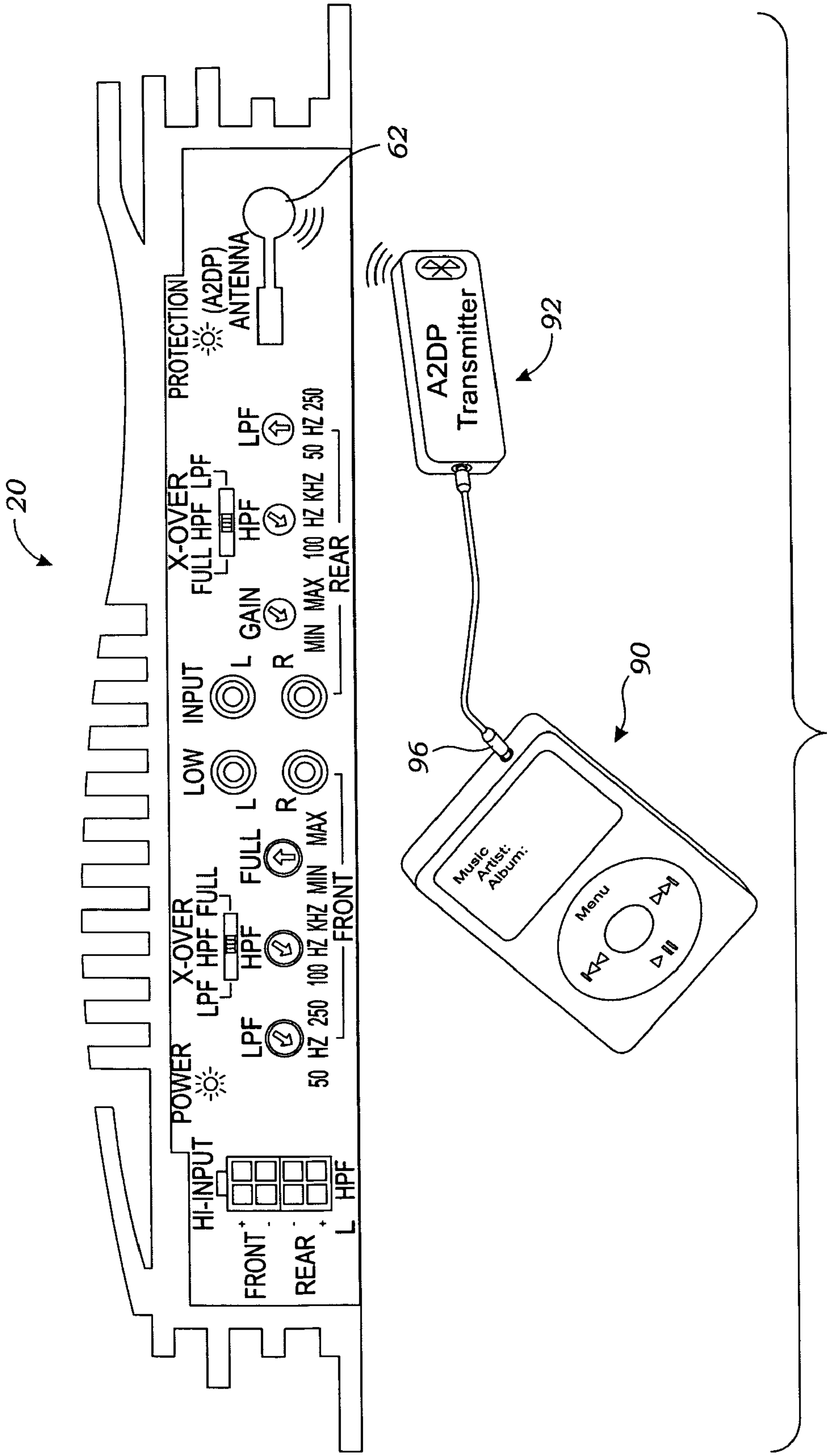
FIG. 7 is a schematic illustrating use thereof in a second exemplary configuration.

Turning to FIG. 7, then, there is shown a schematic of the secondary audio system 10 of the present invention in a second exemplary configuration of use wherein the amplifier 20 is interfacing through a wireless connection with a media player 90 that is itself not equipped with a wireless transmitter. For example, an iPod® MP3 player, though also capable of being wired to the amp 20 through an audio cable 94 as shown in FIG. 6 for a CD player, may yet be wirelessly connected to the amp 20 by first plugging the player 90 into a transmitter 92. The transmitter 92 is configured with a 3.5 mm headphone plug 96 just as the audio cable 94 for plugging directly into the media player's headphone jack (not shown). The transmitter 92 then simply broadcasts the audio signals wirelessly via an appropriate protocol for the receiver 66 installed in the amp 20. In the exemplary embodiment, the transmitter 92 and receiver 66 operate based on the A2DP protocol, though it will be appreciated by those skilled in the art that any such wireless protocol and corresponding transmitters and receivers now known or later developed may be employed in the present invention without departing from its spirit and scope. Once the media player 90 is so connected to the A2DP transmitter 92, the transmitter 92 is powered on, if not already, and then establishes a connection with the amplifier 20 via the amplifier's wireless antenna 62 and A2DP receiver 66. An LED (not shown) or the like on the transmitter may be employed to signify power and/or connection with the amp 20. When the media player 90 is wirelessly connected to the amplifier 20 through the transmitter 92, the player 90 is once again then operated in conventional fashion to play selected music through the one or more primary and/or secondary speakers 114, 80 of the vehicle 100 as powered by the amp 20.

Figure 8:
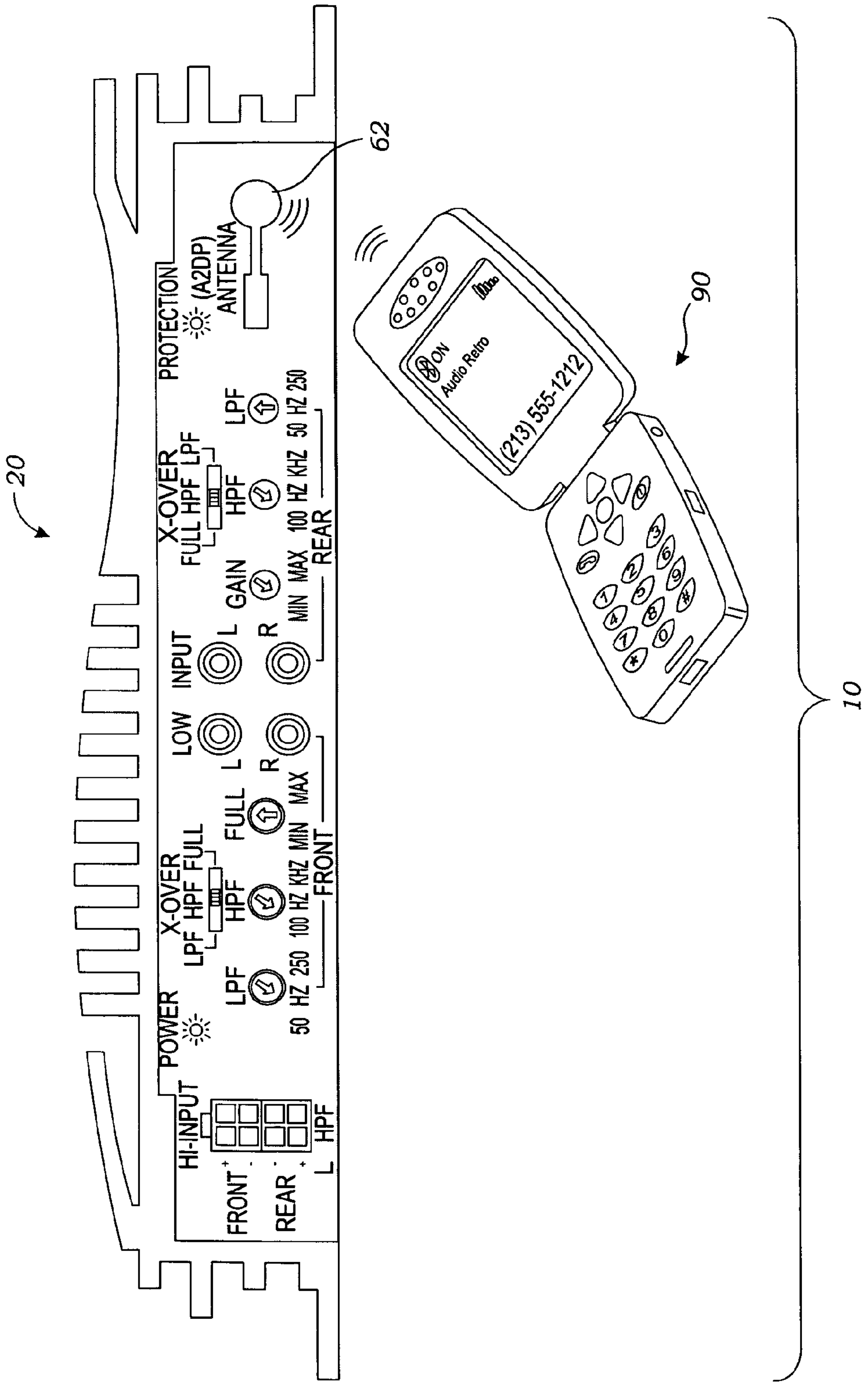
FIG. 8 is a schematic illustrating use thereof in a third exemplary configuration.

Finally, with reference to FIG. 8, there is shown a third exemplary configuration of the secondary audio system 10 of the present invention in use wherein the amplifier 20 is interfacing through a wireless connection with a media player 90 that is itself equipped with a wireless transmitter. In the exemplary embodiment, a media player 90 such as a Bluetooth A2DP equipped cell phone wirelessly connects to the amp 20 through the amp's A2DP antenna 62 and receiver 66 so as to play media or audio content of the phone 90 in the vehicle 100 via the secondary audio system 10. In more detail, following the operating instructions for the Bluetooth A2DP compatible media player (cell phone) 90, Bluetooth transmission from the player 90 is first enabled through whatever steps are necessary. The amplifier 20 will then be detected by the device 90 and displayed in a selection list (e.g., "Audio Retro"). By simply selecting the amp 20 from the list, the wireless A2DP connection will be established. The cell phone or player 90 may then be operated in whatever mode and by whatever means are appropriate to select and play music and other audio content stored thereon through the one or more primary and/or secondary speakers 114, 80 of the vehicle 100 as powered by the amp 20, again all without affecting or in any way operating the vehicle's existing in-dash head unit 112 (FIG. 1), the media player 90 instead effectively serving as the head unit and providing both the intelligence and the control for the audio content played through the amp 20. Once again, while at least three different configurations of the secondary audio system 10 in use have been shown and described, it will be appreciated by those skilled in the art that numerous other configurations based on other devices, connectors, and/or protocols now known or later developed are possible without departing from the spirit and scope of the invention.

While aspects of the invention have been described with reference to at least one exemplary embodiment, it is to be clearly understood by those skilled in the art that the invention is not limited thereto. Rather, the scope of the invention is to be interpreted only in conjunction with the appended claims and it is made clear, here, that the inventor(s) believe that the claimed subject matter is the invention.

What is claimed is:

1. A secondary audio system for use in a vehicle, the vehicle typically being equipped with a primary audio system connected to a power source of the vehicle and including at least an in-dash head unit, the secondary audio system comprising an amplifier configured to be installed in the vehicle and connected to the power source and expressly not connected to the head unit of the primary audio system, the amplifier comprising at least one means for receiving audio content such that the secondary audio system is capable of being operably installed within the vehicle without affecting the primary audio system and specifically without utilizing the head unit.

2. The secondary audio system of claim 1 wherein:

the receiving means is configured to interface with a portable media player having audio content stored therein; and the at least one connection means comprises at least one audio input mounted in the amplifier and electrically connected to a detection circuit input of the amplifier configured for selecting the portable media player connected through a wired connection and sending left and right channels of the audio content of the selected portable media player to a crossover circuit of the amplifier for output through speaker output terminals mounted in the amplifier to the at least one secondary speaker.

3. The secondary audio system of claim 2 wherein an audio cable configured with a headphone plug is plugged into the portable media player and four RCA plugs at the opposite end of the audio cable are plugged into corresponding left and right, front and rear audio inputs of the amplifier.

4. The secondary audio system of claim 1 wherein:

the receiving means is configured to interface with a portable media player having audio content stored therein; and the at least one connection means comprises a wireless antenna electrically connected to a receiver mounted in the amplifier, the receiver being further electrically connected to a detection circuit input of the amplifier configured for selecting the portable media player connected through a wireless connection and sending left and right channels of the audio content of the selected portable media player to a crossover circuit of the amplifier for output through speaker output terminals mounted in the amplifier to the at least one secondary speaker.

5. The secondary audio system of claim 4 wherein a transmitter formed in the portable media player and the receiver mounted in the amplifier together operate on the A2DP protocol.

6. The secondary audio system of claim 4 wherein the portable media player is configured to be non-wireless and an intermediate transmitter is connected to the portable media player.

7. The secondary audio system of claim 6 wherein the intermediate transmitter and the receiver mounted in the amplifier together operate on the A2DP protocol.

8. The secondary audio system of claim 6 wherein an audio cable from the intermediate transmitter is configured with a headphone plug for connecting to the portable media player.

9. The secondary audio system of claim 1 wherein the amplifier is configured on front, top and back walls with cooling fins.

10. The secondary audio system of claim 1 wherein the amplifier is configured with a permanent 12-volt terminal and a remote 12-volt terminal for making the connection to the power source of the vehicle, and wherein the amplifier is further configured with a ground terminal for connecting to a common ground of the vehicle, whereby the permanent 12-volt terminal is capable of being connected to a positive terminal of the power source and the remote 12-volt terminal is capable of being connected to an accessory voltage of the power source.

11. The secondary audio system of claim 1 wherein: a replaceable door panel is capable of being installed in each front door of the vehicle; and a secondary speaker is capable of being installed in each door panel.

12. A secondary audio system for use in a vehicle, the vehicle typically being equipped with a primary audio system connected to a power source of the vehicle and including at least an in-dash head unit connected to a primary speaker, the secondary audio system comprising:

an amplifier configured to be installed in the vehicle and directly connected to the power source and expressly not connected to the head unit or the primary speaker of the primary audio system, the amplifier comprising at least one means for connecting to a portable media player having audio content stored therein; and at least one secondary speaker configured to be installed in the vehicle separate from the at least one primary speaker and connected to the amplifier, whereby the amplifier is capable of being powered by the power source and connected to by the portable media player for playing the audio content stored in the portable media player through that at least one secondary speaker, such that the secondary audio system is capable of being operably installed within the vehicle without affecting the primary audio system and specifically without utilizing the head unit and the primary speaker.

13. A secondary audio system for use in a vehicle, the vehicle typically being equipped with a primary audio system connected to a power source of the vehicle and including at least an in-dash head unit, the secondary audio system comprising an amplifier configured to be installed in the vehicle and directly connected to the power source and to at least one speaker installed in the vehicle and expressly not connected to the head unit of the primary audio system, the amplifier comprising a wireless receiver, whereby the amplifier is capable of being powered by the power source and of being wirelessly connected to by a portable media player through a wireless transmitter for playing audio content stored in the portable media player through the at least one speaker, such that the secondary audio system is capable of being operably installed within the vehicle without affecting the primary audio system and specifically without utilizing the head unit.

14. The secondary audio system of claim 13 wherein a wireless antenna is electrically connected to the receiver, the receiver being further electrically connected to a detection circuit input of the amplifier for selecting the portable media player connected through a wireless connection and sending left and right channels of the audio content of the selected portable media player to a crossover circuit of the amplifier for output through speaker output terminals mounted in the amplifier to the at least one speaker.

15. The secondary audio system of claim 14 wherein the transmitter formed in the portable media player and the receiver mounted in the amplifier together operate on the A2DP protocol.

16. The secondary audio system of claim 14 wherein the portable media player is configured to be non-wireless and an intermediate transmitter is connected to the portable media player through an audio cable from the intermediate transmitter configured with a headphone plug for plugging into the portable media player, and wherein the intermediate transmitter and the receiver together operate on the A2DP protocol.

17. A method of using a secondary audio system in a vehicle, the vehicle being equipped with a primary audio system connected to a power source of the vehicle and including at least an in-dash head unit, comprising the steps of:

installing an amplifier in the vehicle;

electrically connecting the amplifier directly to the power source of the vehicle, whereby the amplifier is powered by the power source;

electrically connecting the amplifier directly to at least one speaker installed in the vehicle, while expressly not connecting the amplifier to the head unit of the primary audio system; and connecting a portable media player to the amplifier for playing audio content stored therein through the at least one speaker, such that the secondary audio system is operably installed within the vehicle without affecting the primary audio system and specifically without utilizing, removing or rendering inoperable the head unit, the portable media player effectively substituting for the head unit.

18. The method of claim 17 wherein the step of electrically connecting the amplifier to the power source of the vehicle consists essentially of the steps of:

electrically connecting a permanent 12-volt terminal of the amplifier to a positive terminal of the power source;

electrically connecting a remote 12-volt terminal of the amplifier to an accessory voltage of the power source; and electrically connecting a ground terminal of the amplifier to a common ground of the vehicle.

19. The method of claim 17 wherein the step of electrically connecting the amplifier directly to the at least one speaker installed in the vehicle consists essentially of the steps of:

installing a removable door panel in a door of the vehicle;

installing the at least one speaker in the door panel; and connecting speaker output terminals mounted in the amplifier to the at least one speaker.

20. The method of claim 17 wherein the step of connecting a portable media player to the amplifier for playing audio content stored therein through the at least one speaker further comprises the steps of:

plugging a headphone plug of an audio cable into the portable media player;

plugging four RCA plugs at the opposite end of the audio cable into corresponding left and right, front and rear audio inputs mounted on the amplifier;

detecting the portable media player through a detection circuit input of the amplifier electrically connected to the audio inputs; and sending left and right channels of the audio content of the selected portable media player from the detection input circuit to a crossover circuit of the amplifier for output through speaker output terminals mounted in the amplifier to the at least one speaker.

21. The method of claim 17 wherein the step of connecting a portable media player to the amplifier for playing audio content stored therein through the at least one speaker further comprises the steps of:

plugging a headphone plug of an audio cable of an intermediate transmitter into the portable media player;

powering the portable media player and the intermediate transmitter so as to wirelessly transmit the audio content from the portable media player;

receiving at the amplifier by way of a wireless antenna connected to a receiver of the amplifier the wireless audio content of the portable media player as transmitted by the intermediate transmitter;

detecting the portable media player through a detection circuit input of the amplifier electrically connected to the receiver; and sending left and right channels of the audio content of the selected portable media player from the detection input circuit to a crossover circuit of the amplifier for output through speaker output terminals mounted in the amplifier to the at least one speaker.

22. The method of claim 17 wherein the step of connecting a portable media player to the amplifier for playing audio content stored therein through the at least one speaker further comprises the steps of:

powering the portable media player having a wireless transmitter so as to wirelessly transmit the audio content from the portable media player;

receiving at the amplifier by way of a wireless antenna connected to a receiver of the amplifier the wireless audio content of the portable media player as transmitted by the intermediate transmitter;

detecting the portable media player through a detection circuit input of the amplifier electrically connected to the receiver; and sending left and right channels of the audio content of the selected portable media player from the detection input circuit to a crossover circuit of the amplifier for output through speaker output terminals mounted in the amplifier to the at least one speaker.

* * * * *